US012677430B2

(12) United States Patent
Yu et al.

(10) Patent No.: US 12,677,430 B2
(45) Date of Patent: Jul. 7, 2026

(54) SEMICONDUCTOR STRUCTURE AND FORMING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Hailong Yu, Shanghai (CN); Bo Su, Shanghai (CN); Hansu Oh, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 792 days.

(21) Appl. No.: 17/955,955

(22) Filed: Sep. 29, 2022

(65) Prior Publication Data

US 2023/0100058 A1 Mar. 30, 2023

(30) Foreign Application Priority Data

Sep. 29, 2021 (CN) .......................... 202111155645.9

(51) Int. Cl.
*H10D 30/01* (2025.01)
*H10D 30/43* (2025.01)
(Continued)

(52) U.S. Cl.
CPC ........... *H10D 30/014* (2025.01); *H10D 30/43* (2025.01); *H10D 30/6729* (2025.01); (Continued)

(58) Field of Classification Search
CPC .. H10D 30/014; H10D 30/43; H10D 30/6735; H10D 30/6741; H10D 30/6757; H10D 30/797; H10D 62/116; H10D 62/121; H10D 62/151; B82Y 10/00; B82Y 40/00; H01L 21/02603; H01L 21/764
See application file for complete search history.

(56) References Cited

U.S. PATENT DOCUMENTS

| | | | |
|---|---|---|---|
| 2019/0181224 A1* | 6/2019 | Zhang | H10D 62/121 |
| 2020/0091288 A1* | 3/2020 | Lee | H10D 62/121 |
| 2022/0173220 A1* | 6/2022 | Sun | H10D 30/6735 |

* cited by examiner

*Primary Examiner* — Edward Chin
(74) *Attorney, Agent, or Firm* — Anova Law Group, PLLC

(57) ABSTRACT

Semiconductor structure and forming method thereof are provided. The forming method includes: providing a substrate; forming a plurality of initial composite layers on a portion of the substrate; forming a plurality of source and drain layers on surfaces of the plurality of channel layers exposed by a first opening and grooves by using a selective epitaxial growth process, the plurality of source and drain layers being parallel to a first direction and distributed along a second direction, the second direction being parallel to a normal direction of the substrate, and gaps being between adjacent source and drain layers; forming contact layers on surfaces of the plurality of source and drain layers and in the gaps; and forming a conductive structure on a surface of a contact layer on a source and drain layer of the plurality of source and drain layers.

13 Claims, 8 Drawing Sheets

(51) Int. Cl.

| | |
|---|---|
| *H10D 30/67* | (2025.01) |
| *H10D 62/10* | (2025.01) |
| *H10D 64/01* | (2025.01) |
| *H10P 14/20* | (2026.01) |
| *H10P 14/60* | (2026.01) |
| *H10P 50/28* | (2026.01) |

(52) U.S. Cl.

CPC ....... *H10D 30/6735* (2025.01); *H10D 62/121* (2025.01); *H10D 64/0112* (2026.01); *H10D 64/015* (2025.01); *H10D 64/017* (2025.01); *H10D 64/018* (2025.01); *H10P 14/3411* (2026.01); *H10P 14/3462* (2026.01); *H10P 14/6308* (2026.01); *H10P 14/6319* (2026.01); *H10P 50/282* (2026.01)

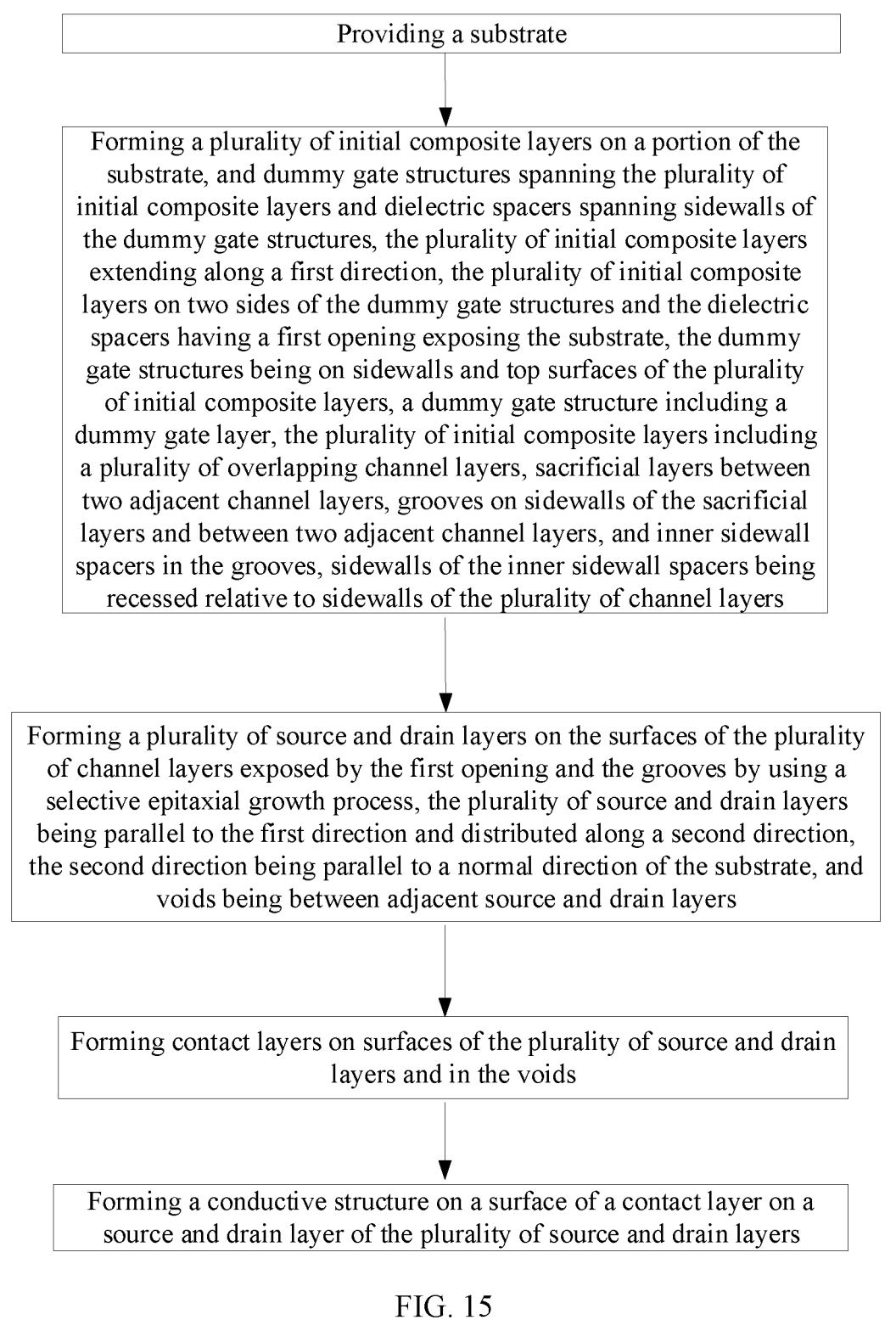

Providing a substrate

Forming a plurality of initial composite layers on a portion of the substrate, and dummy gate structures spanning the plurality of initial composite layers and dielectric spacers spanning sidewalls of the dummy gate structures, the plurality of initial composite layers extending along a first direction, the plurality of initial composite layers on two sides of the dummy gate structures and the dielectric spacers having a first opening exposing the substrate, the dummy gate structures being on sidewalls and top surfaces of the plurality of initial composite layers, a dummy gate structure including a dummy gate layer, the plurality of initial composite layers including a plurality of overlapping channel layers, sacrificial layers between two adjacent channel layers, grooves on sidewalls of the sacrificial layers and between two adjacent channel layers, and inner sidewall spacers in the grooves, sidewalls of the inner sidewall spacers being recessed relative to sidewalls of the plurality of channel layers Forming a plurality of source and drain layers on the surfaces of the plurality of channel layers exposed by the first opening and the grooves by using a selective epitaxial growth process, the plurality of source and drain layers being parallel to the first direction and distributed along a second direction, the second direction being parallel to a normal direction of the substrate, and voids being between adjacent source and drain layers Forming contact layers on surfaces of the plurality of source and drain layers and in the voids Forming a conductive structure on a surface of a contact layer on a source and drain layer of the plurality of source and drain layers

FIG. 15

SEMICONDUCTOR STRUCTURE AND FORMING METHOD THEREOF

CROSS-REFERENCE TO RELATED APPLICATION

This application claims priority of Chinese Patent Application No. 202111155645.9, filed on Sep. 29, 2021, the entire contents of which are hereby incorporated by reference.

FIELD OF THE DISCLOSURE

The present disclosure generally relates to the field of semiconductor manufacturing and, more particularly, relates to a semiconductor structure and a forming method thereof.

BACKGROUND

In current semiconductor industry, a fin field effect transistor (FinFET) is an emerging multi-gate device. Compared with a planar metal-oxide semiconductor field effect transistors (MOSFETs), the FinFET has stronger short-channel rejection and higher operating current and is now widely applied in various semiconductor devices. However, with a further development of semiconductor technology, a transistor size has been reduced to less than a few nanometers. As a FinFET size is reduced to its limit, fin distance, short channel effect, electrical leakage or material limitation can make a transistor fabrication difficult and may not even complete the physical structure.

Gate-all-around (GAA) devices have become an emerging direction of research and development in the industry. A GAA technology realizes a four-sided wrapping of a gate to a channel, and a source and drain are no longer in contact with a substrate. Instead, a basic structure and functions of the MOSFET are realized after a plurality of line-shaped (can be understood as stick-shaped), plate-shaped, sheet-shaped, and other sources and drains are distributed laterally perpendicular to the gate. The above design largely solves various problems, including a capacitive effect and the like, caused by a reduced gate pitch size. In addition, the channel is wrapped by the gate on all four sides, so a channel current of the GAA device is also smoother than a channel current of the FinFET's whose channel is wrapped by the gate on three sides.

However, performance of an existing GAA device needs to be further improved.

BRIEF SUMMARY OF THE DISCLOSURE

One aspect of the present disclosure provides a semiconductor structure. The semiconductor structure includes: a substrate; a plurality of composite layers on a portion of the substrate, the plurality of composite layers extending along a first direction, the plurality of composite layers having a first opening exposing a surface of the substrate, a composite layer of the plurality of composite layers including a plurality of channel layers stacked along a normal direction of the surface of the substrate and second openings between two adjacent channel layers, and the second openings making space between the two adjacent channel layers, and grooves being between the two adjacent channel layers and on sidewalls of the second openings; gate structures on surfaces of the plurality of channel layers and in the second openings, the gate structures surrounding the plurality of channel layers and extending along a second direction, the first direction and the second direction being perpendicular to each other; dielectric spacers on sidewalls of the gate structures, top surfaces of the dielectric spacers being flush with top surfaces of the gate structures, and outer side surfaces of the dielectric spacers being flush with sidewall surfaces of the plurality of channel layers; a composite layer of the plurality of composite layers further including inner sidewall spacers, the inner sidewall spacers being in the grooves and on the sidewalls of the second openings, and sidewalls of the inner sidewall spacers being recessed relative to sidewalls of the plurality of channel layers; a plurality of source and drain layers on the surfaces of the plurality of channel layers exposed by the first opening and the grooves, the source and drain layers being parallel to the first direction and distributed along a second direction, the second direction being parallel to a normal direction of the surface of the substrate, and gaps being between adjacent source and drain layers; contact layers on surfaces of the plurality of source and drain layers and in the gaps; and a conductive structure on a source and drain layer of the plurality of source and drain layers.

Another aspect of the present disclosure provides a method for forming a semiconductor structure. The method includes: providing a substrate; forming a plurality of initial composite layers on a portion of the substrate, and dummy gate structures spanning the plurality of initial composite layers and dielectric spacers spanning sidewalls of the dummy gate structures, the plurality of initial composite layers extending along a first direction, the plurality of initial composite layers on two sides of the dummy gate structures and the dielectric spacers having a first opening exposing the substrate, the dummy gate structures being on sidewalls and top surfaces of the plurality of initial composite layers, a dummy gate structure including a dummy gate layer, the plurality of initial composite layers including a plurality of stacked channel layers, sacrificial layers between two adjacent channel layers, grooves on sidewalls of the sacrificial layers and between two adjacent channel layers, and inner sidewall spacers in the grooves, sidewalls of the inner sidewall spacers being recessed relative to sidewalls of the plurality of channel layers; forming a plurality of source and drain layers on the surfaces of the plurality of channel layers exposed by the first opening and the grooves by using a selective epitaxial growth process, the plurality of source and drain layers being parallel to the first direction and distributed along a second direction, the second direction being parallel to a normal direction of the substrate, and gaps being between adjacent source and drain layers; forming contact layers on surfaces of the plurality of source and drain layers and in the gaps; and forming a conductive structure on a surface of a contact layer on a source and drain layer of the plurality of source and drain layers.

Other aspects or embodiments of the present disclosure can be understood by those skilled in the art in light of the description, the claims, and the drawings of the present disclosure.

BRIEF DESCRIPTION OF THE DRAWINGS

FIG. 15 illustrates an exemplary method for forming a semiconductor structure according to various disclosed embodiments of the present disclosure.

DETAILED DESCRIPTION

As described in the background, performances of semiconductor devices formed in the existing technologies need to be improved. Now an analysis is carried out in conjunction with a semiconductor structure.

FIGS. 1-4 illustrate schematic diagrams of a process of forming a semiconductor structure.

Figure 1:
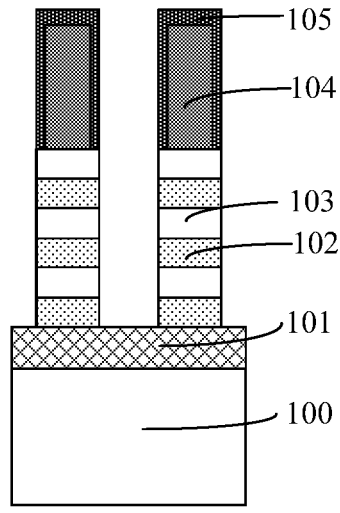
FIGS. 1-4 illustrate schematic diagrams of a process of forming a semiconductor structure.

Referring to FIG. 1, the process of forming a semiconductor structure includes: providing a substrate 100; and forming an insulating dielectric layer 101 on the substrate 100, a plurality of composite layers on a surface of the insulating dielectric layer 101, and dummy gate structures on surfaces of plurality of the composite layer. A dummy gate structure includes a dummy gate 104 and a protective layer 105 on a surface of a gate layer. A composite layer of the plurality of composite layers includes a plurality of overlapping sacrificial layers 102, and a channel layer 103 between two adjacent sacrificial layers 102.

Figure 2:
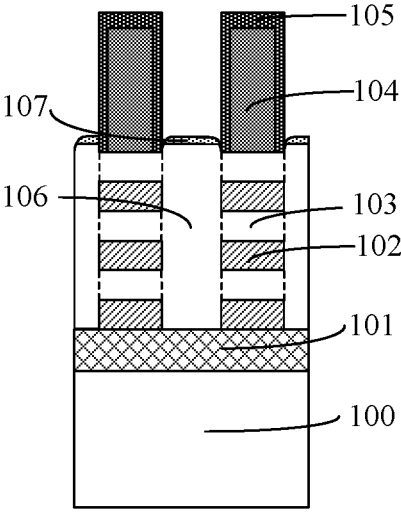

Referring to FIG. 2, the process of forming a semiconductor structure further includes: forming a source-drain layer 106 on the substrate 100 on two sides of the plurality of composite layers, and the source-drain layer 106 further being on sidewall surfaces of channel layers 103; and forming a contact layer 107 on a surface of the source-drain layer 106.

Figure 3:
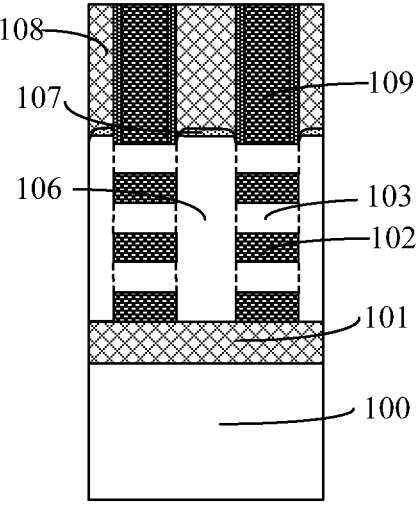

Referring to FIG. 3, the process of forming a semiconductor structure further includes: forming a first dielectric material layer (not shown) on a surface of the substrate 100, and the first dielectric material layer being on a surface of the source-drain layer 106 and sidewalls and surfaces of the dummy gate structures; planarizing the first dielectric material layer until a top surface of the dummy gate 104 is exposed to form interlayer dielectric layers 108; removing dummy gates 104, and forming gate openings (not shown) in the interlayer dielectric layers 108; removing the sacrificial layers 102 exposed by the gate openings to form second openings between adjacent channel layers 103 (not marked); and forming gate structures 109 in the gate openings and the second openings.

Figure 4:
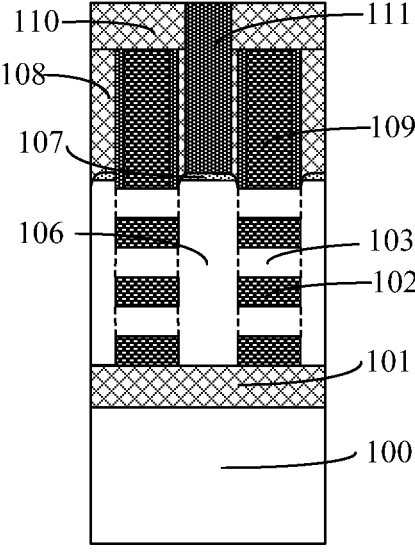

Referring to FIG. 4, the process of forming a semiconductor structure further includes: forming dielectric material layers 110 on surfaces of the interlayer dielectric layers 108 and the gate structures 109; forming a contact hole (not shown) in the dielectric material layer 110, and the contact hole exposing a surface of the contact layer 107; forming a conductive structure 111 in the contact hole.

The above method is used in a GAA device structure. A material of the contact layer 107 is a metal silicide, and the metal silicide is configured to reduce a contact resistance between the conductive structure 111 and the source-drain layer 106. However, as a semiconductor feature size decreases, a contact area between the conductive structure 111 and the source-drain layer 106 becomes smaller and smaller, resulting in an increase in the contact resistance. The contact layer 107 formed by the method is insufficient to reduce the contact resistance between the conductive structure 111 and the source-drain layer 106, thereby affecting performance of the GAA device.

To solve the above problems, the present disclosure provides a method for forming a semiconductor structure. In the method, a selective epitaxial growth process is applied to form a plurality of source and drain layers on a surface of a channel layer exposed by a first opening and a groove. The plurality of source and drain layers are parallel to a first direction and are distributed along a second direction. The second direction is parallel to a substrate normal direction. There are gaps between adjacent source and drain layers. Contact layers are formed on surfaces of the plurality of source and drain layers and in the gaps. Since the contact layers are on the surfaces of the plurality of source and drain layers, contact areas between the contact layers and the plurality of source and drain layers are increased, thereby reducing contact resistances on the surfaces of the plurality of source and drain layers and improving performance of a device.

To make the above objects, features and beneficial effects of the present disclosure more clearly understood, a specific embodiment of the present disclosure is described in detail below with reference to accompanying drawings.

Figure 5:
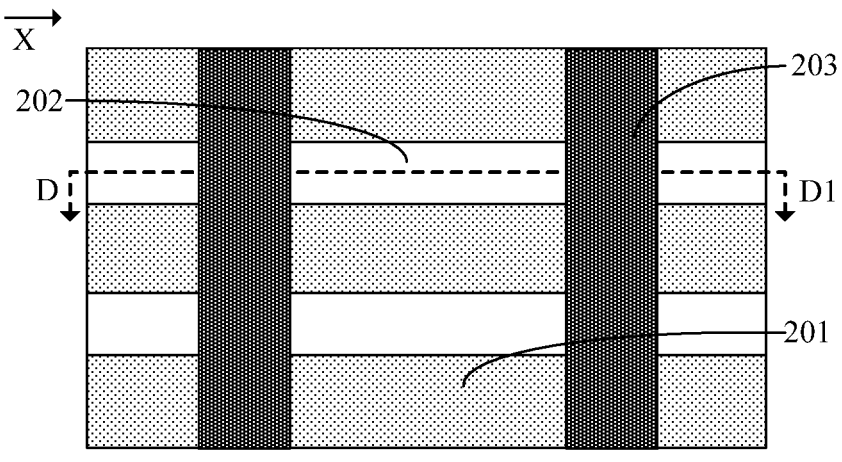
FIGS. 5-14 illustrate cross-sectional views of each step in a method for forming a semiconductor structure according to one embodiment of the present disclosure.
Figure 6:
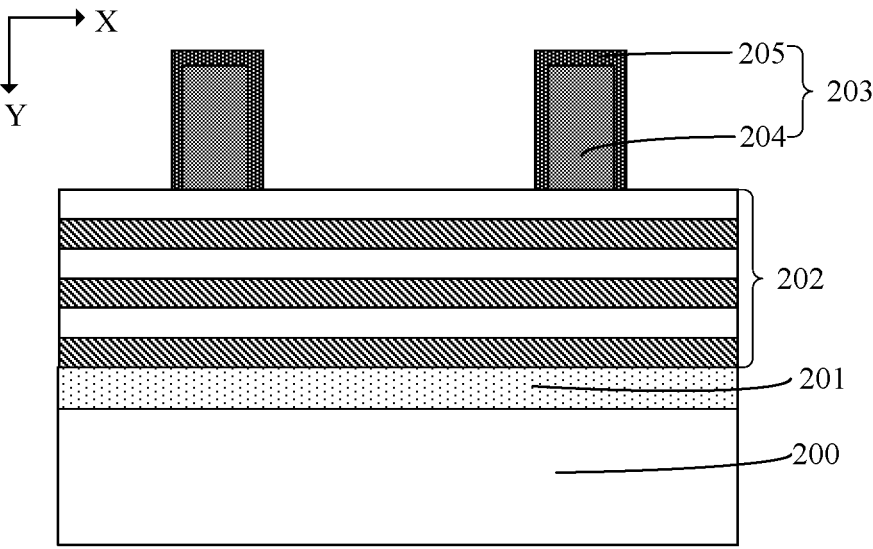

FIGS. 5-14 illustrate cross-sectional views of each step in a method for forming a semiconductor structure according to one embodiment of the present disclosure. FIG. 15 illustrates an exemplary method for forming a semiconductor structure according to various disclosed embodiments of the present disclosure FIG. 5 illustrates a top view of FIG. 6, and FIG. 6 illustrates a cross-sectional view of FIG. 5 along a DD1 direction. The method for forming a semiconductor structure includes providing a substrate 200.

In the embodiment, a material of the substrate 200 is single crystal silicon. In other embodiments, the material of the substrate 200 may also be polycrystalline silicon, germanium, silicon germanium, gallium arsenide, silicon-on-insulator, germanium-on-insulator, or another semiconductor material.

In the embodiment, the substrate has a well region (not shown), and the well region has first dopant ions. Specifically, in the embodiment, the first doping ions are N-type ions, which are used to form a well region of a PMOS device. In other embodiments, the first dopant ions are P-type ions, which are used to form a well region of a NMOS device.

Subsequently, the method for forming a semiconductor structure includes forming a plurality of initial composite layers, and dummy gate structures spanning the plurality initial composite layers and dielectric spacers on sidewalls of the dummy gate structures on a portion of the substrate 200, the plurality of initial composite layers extending along a first direction, the dummy gate structures and the plurality of initial composite layer on two sides of the dielectric spacers having a first opening exposing the substrate 200, the dummy gate structures being on sidewalls and top surfaces of the plurality of initial composite layers, a dummy gate structure including a dummy gate layer, an initial composite layer including a plurality of stacked channel layers, sacrificial layers between two adjacent channel layers, grooves on sidewalls of sacrificial layers and between two adjacent channel layers, and inner sidewall spacers in the grooves, and sidewalls of the inner sidewall spacers being recessed relative to sidewalls of the plurality of channel layers.

In the embodiment, a surface of the substrate 200 has an insulating dielectric layer. The plurality of composite layers is on a portion of a surface of the insulating dielectric layer. The first opening exposes the insulating dielectric layer. Regarding the method for forming the insulating dielectric layer, the initial composite layers, the dummy gate structures, and the dielectric spacers, reference can be made to FIGS. 5-10.

Referring to FIG. 5 and FIG. 6, the method for forming a semiconductor structure includes: forming a first sacrificial material layer 201 and an initial composite material layer on a surface of the first sacrificial material layer 201 on the surface of the substrate 200, the initial composite material layer including a plurality of stacked channel material layers (not shown) and a plurality of second sacrificial material layers (not shown) between two adjacent channel layers; forming a mask layer (not shown) on a surface of the initial composite material layer, and the mask layer exposing a portion of the initial composite material layer; etching the initial composite material layer by using the mask layer as a mask until the surface of the first sacrificial material layer 201 is exposed to form a plurality of composite material layers 202 extending along a first direction X; forming a plurality of dummy gate structures 203 spanning the composite material layer 202, and the plurality of dummy gate structures 203 being on part of sidewalls and surfaces of the plurality of composite material layer 202.

The first direction X is a channel direction.

A dummy gate structure 203 includes a dummy gate layer 204. In the embodiment, the dummy gate structure 203 further includes a gate sidewall spacer 205 on a sidewall of the dummy gate layer 204. Specifically, the gate sidewall spacer 205 is also on a top surface of the dummy gate layer 204.

The first sacrificial material layer 201 occupies space for a subsequent formation of the insulating dielectric layer.

In the embodiment, before forming the first sacrificial material layer 201, the method for forming a semiconductor structure further includes implanting second dopant ions on the surface of the substrate 200. A conductivity type of the second dopant ions is different from a conductivity type of the first dopant ions. Specifically, the second doping ions are P-type ions.

A material of the plurality of second sacrificial material layers is different from a material of the plurality of channel material layers. The plurality of channel material layers are used to form the plurality of channel layers, and the plurality of second sacrificial material layers is used to form initial sacrificial layers subsequently. The initial sacrificial layers are used to form the plurality of sacrificial layers, and the plurality of sacrificial layers occupies space for the subsequent formation of the gate structures. A material of the plurality of second sacrificial material layers has a higher etching selectivity ratio relative to a material of the plurality of channel material layers, so that when the plurality of sacrificial layers is subsequently removed, an influence on the plurality of channel layers is small. Compared with the material of the plurality of channel material layers, the material of the plurality of second sacrificial material layers has better a lattice matching to obtain smooth interfaces between the plurality of sacrificial layers and the plurality of channel layers. Therefore, surfaces of the plurality of channel layers formed subsequently are smooth, thereby helping obtain a device with good performance.

The material of the plurality of second sacrificial material layers includes silicon. The material of the plurality of channel material layers includes germanium and silicon. In the embodiment, the material of the plurality of channel material layers is silicon and the material of the plurality of second sacrificial material layers is silicon germanium. In other embodiments, the material of the plurality of channel material layers is Ge or GeSi. In other embodiments, the material of the plurality of second sacrificial material layers may be ZnS, ZnSe, BeS or GaP or the like.

Figure 7:
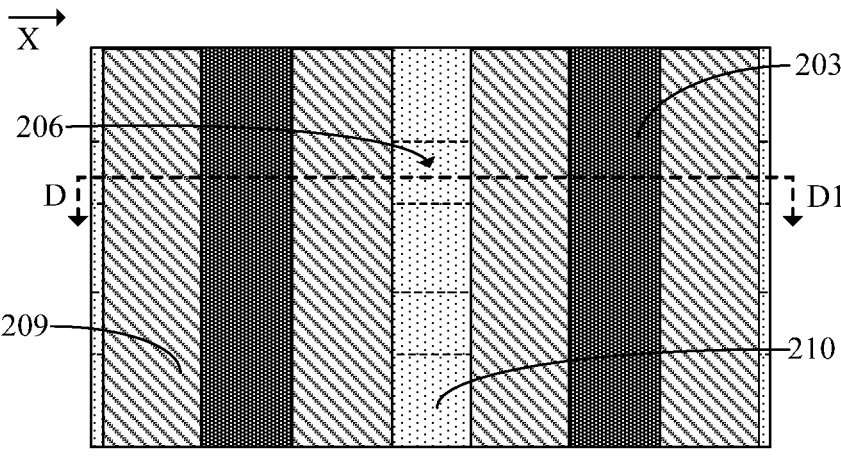
Figure 8:
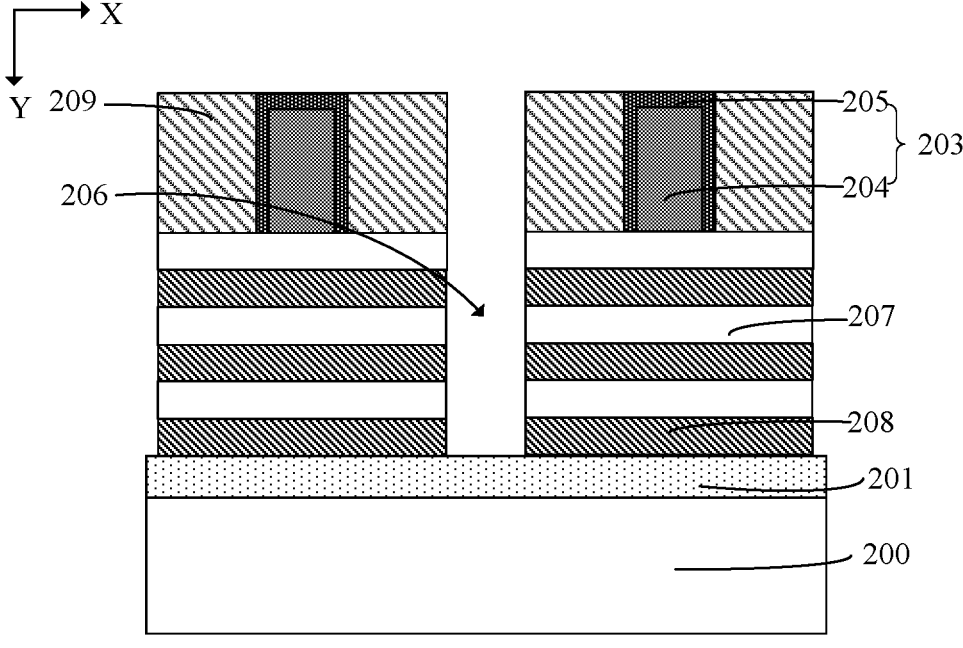

FIG. 7 illustrates a top view of FIG. 8, and FIG. 8 illustrates a cross-sectional view of FIG. 7 along the DD1 direction. The method for forming a semiconductor structure further includes: forming dielectric spacers 209 on sidewalls of the dummy gate structures 203; etching the plurality of composite material layers 202 on two sides of the dummy gate structures 203 and the dielectric spacers 209 by using the dummy gate structure 203 and the dielectric spacer 209 as masks until the first sacrificial material layer 201 is exposed to form transition composite layers and a first opening 206. A transition composite layer includes a channel layer 207 and an initial sacrificial layer 208 between channel layers 207.

A dimension range of the dielectric spacer 209 along the first direction X is greater than 3 nanometers.

Figure 9:
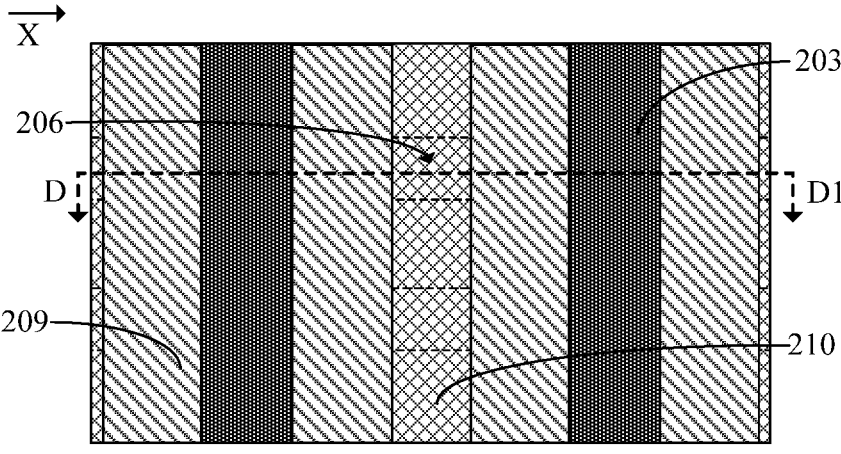
Figure 10:
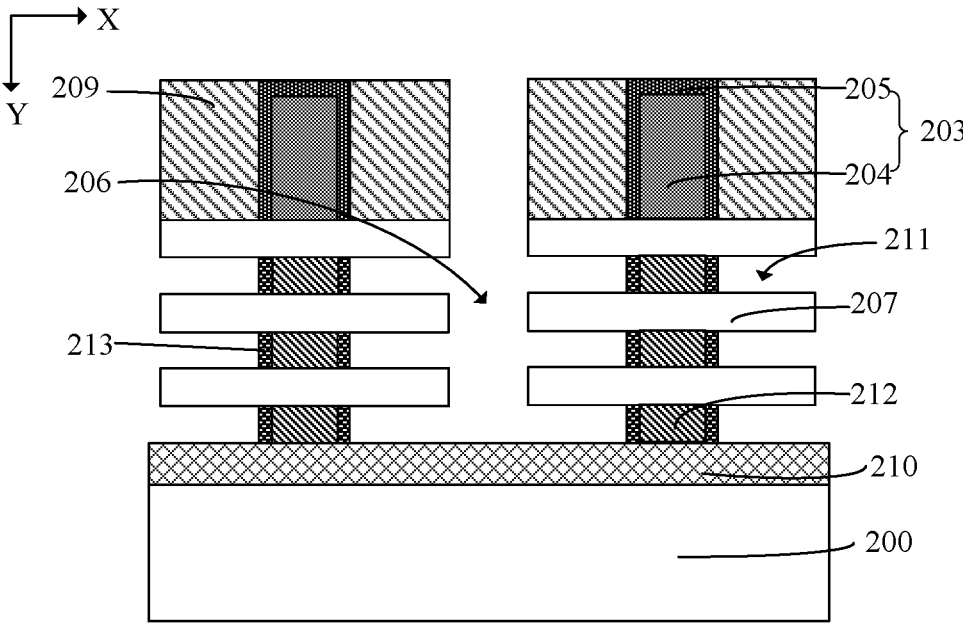

Referring to FIG. 9 and FIG. 10, the method for forming a semiconductor structure further includes: removing the first sacrificial material layer 201 to form an insulating groove on the surface of the substrate 200 (not shown) after forming the transition composite layers; forming an insulating dielectric layer 210 in the insulating groove, and the insulating dielectric layer 210 being also between the substrate 200 and the transition composite layers; etching initial sacrificial layers 208 to form grooves 211 between two adjacent channel layers 207 after forming the insulating dielectric layer, and forming sacrificial layers 212 with the initial sacrificial layers 208; and forming inner sidewall spacers 213 formed in the grooves 211.

A material of the first sacrificial material layer 201 is different from the material of the second sacrificial material layers. The initial sacrificial layers 208 are formed by the second sacrificial material layers. Therefore, the material of the first sacrificial material layer 201 is different from a material of the initial sacrificial layers 208. The material of the first sacrificial material layer 201 is different from the material of the substrate 200, so that when the first sacrificial material layer 201 is removed, an etching process of the first sacrificial material layer 201 with a larger etching selectivity ratio relative to the initial sacrificial layers 208 and an etching process of the first sacrificial material layer 201 with a larger etching selectivity ratio relative to the substrate 200 can be selected to reduce etching damages to the initial sacrificial layers 208 and the substrate 200.

The material of the first sacrificial material layer includes germanium and silicon, and in the first sacrificial material layer, a composition ratio of germanium and silicon ranges from 1:10 to 1:2. The material of the second sacrificial material layers includes germanium and silicon, and in the second sacrificial material layer, a composition ratio of germanium and silicon ranges from 2:5 to 7:10. The material of the plurality of channel material layers includes silicon. A composition ranges of germanium and silicon in the first sacrificial material layer and the second sacrificial material layers are different, so that in a process of etching the first sacrificial material layer 201, the first sacrificial material layer 201 have a larger etching selectivity ratio relative to the initial sacrificial layers 208.

The method for forming the insulating dielectric layer 210 includes: forming a first dielectric material layer (not marked) on the surface of the substrate 200 and in the insulating groove, the first dielectric material layer further being on sidewalls of the plurality of initial composite layers, and on sidewalls and top surfaces of the dummy gate structures 203; and etching the first dielectric material layer until the sidewalls and the top surfaces of the dummy gate structures 203 and the sidewalls of the plurality of initial composite layers are exposed.

In the embodiment, specifically, the method for forming the insulating dielectric layer 210 includes: forming the first dielectric material layer (not shown) on the surface of the substrate 200 and in the insulating groove, the first dielectric material layer further being on the sidewalls of the plurality of initial composite layer, the sidewalls and the top surface of the dielectric spacers 209 and the top surfaces of the dummy gate structures 203; and etching the first dielectric material layer until the top surfaces of the dummy gate structures 203, the sidewalls and the top surfaces of the dielectric spacers 209, and the sidewalls of the plurality of initial composite layers are exposed.

A process of etching the first dielectric material layer includes an inductively coupled plasma etching process or a capacitively coupled plasma etching process.

A process of forming the first dielectric material layer includes an atomic layer deposition process. The atomic layer deposition process is favorable for forming a uniform first dielectric material layer, and has a good trench filling capability, which helps improve performance of the insulating dielectric layer 210.

A selectivity ratio of an etching process for removing the first sacrificial material layer to the first sacrificial material layer and the second sacrificial material layer ranges from 10:1 to 150:1.

The inner sidewall spacers 213 are on sidewalls of the sacrificial layers 212, and the sidewalls of the inner sidewall spacers 213 are recessed relative to sidewalls of the channel layers 207.

In the embodiment, a method for forming the inner sidewall spacers 213 includes: forming a second dielectric material layer on a surface of the insulating dielectric layer 210, in the grooves 211, on sidewall surfaces of the transition composite layers, on sidewalls and top surfaces of the dielectric spacers 209, and on top surfaces of the dummy gate structures 203; etching back the second dielectric material layer until the surface of the insulating dielectric layer 210, the sidewall surfaces of the transition composite layers, the top surfaces of the dummy gate structures 203, the sidewalls and the top surfaces of the dielectric spacers 209 are exposed, forming initial inner sidewall spacers (not shown) in the grooves 211; and etching the initial inner sidewall spacers until sidewalls of the initial inner sidewall spacers are recessed relative to the sidewalls of the channel layers 207 to form the inner sidewall spacers 213.

A process of etching the initial inner sidewall spacers includes a plurality of dry etching processes, and each dry etching process includes oxidizing surfaces of the initial inner sidewall spacers to form an oxide film on the surfaces of the initial inner sidewall spacers; and etching to remove the oxide film.

The oxidation treatment process includes a plasma treatment process. A process gas of the plasma treatment process includes a plasma gas mixture of argon, oxygen and helium.

The etching process is a pulsed laser process. A process gas of the pulsed laser process includes carbon fluoride or hydrofluorocarbon gas.

In the embodiment, sidewalls of gate sidewall spacers 205 are flush with the sidewalls of the inner sidewall spacers 213. The inner sidewall spacers 213 are configured to isolate the gate structures and the source-drain layers to a gap interdiffusion of ions between the source-drain layers and the gate structures and improve performance stability of a device.

Figure 11:
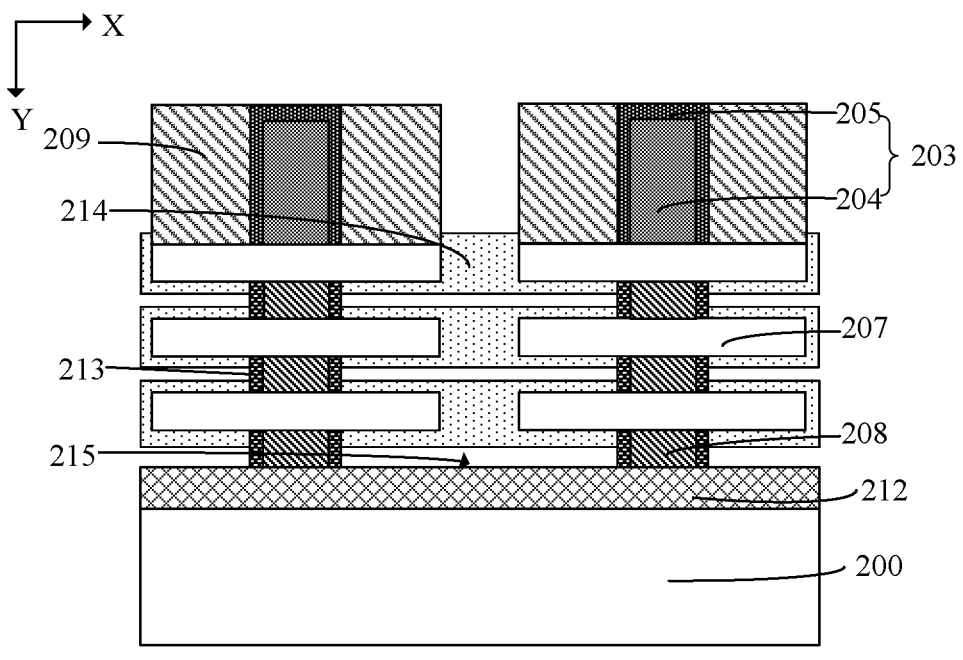

A view direction of FIG. 11 is same as a view direction of FIG. 10. A plurality of source and drain layers 214 is formed on surfaces of the channel layers 207 exposed by the first opening 206 and the grooves 211 by using a selective epitaxial growth process. The plurality of source and drain layers 214 are parallel to the first direction X and distributed along a second direction Y, the second direction Y is parallel to a normal direction of the substrate 200, and there are gaps 215 between adjacent source and drain layers 214.

A first pitch is between two adjacent channel layers 207 along the second direction Y, a second pitch is between two adjacent channel layers along the first direction X, and the first pitch is greater than the second pitch. A purpose of the first pitch being greater than the second pitch is to make epitaxial materials of the source and drain layers on surfaces of the two adjacent channel layers along the first direction X to be grown and merged before the source and drain layers on the surfaces of the two adjacent channel layers in the second direction Y are grown and merged, so that the gaps 215 are formed on the source and drain layers 214 on the surfaces of the two adjacent channel layers in the second direction Y. The gaps 215 are configured to form contact layers.

A range of the first pitch is 12 nanometers to 20 nanometers, and a range of the second pitch is less than 12 nanometers.

The selective epitaxial growth process includes a plurality of film forming processes, and each film forming process includes forming a material film, and an etching process after forming the material film.

Process parameters of the etching process include: an etching gas including hydrogen chloride or chlorine gas, an etching temperature ranging from 100 degrees Celsius to 450 degrees Celsius, and a pressure ranging from 5 mTorr to 15 mTorr.

The selective epitaxial growth process enables a directional growth of epitaxial materials on surfaces of the channel layers 207, thereby helping to form source and drain layers with better morphologies, reducing a possibility that the source and drain layers are connected along the second direction Y, helping to optimize morphologies of formed source and drain layers and improving qualities of the formed source and drain layers.

Figure 12:
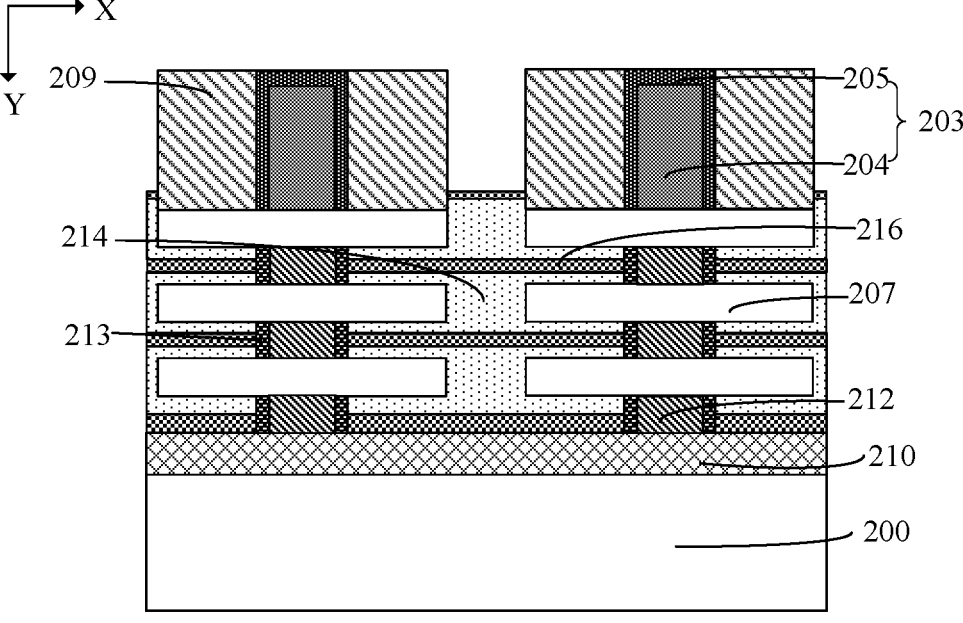

A view direction of FIG. 12 is same as a view direction of FIG. 10. Contact layers 216 are formed on surfaces of the plurality of source and drain layers 214 and in the gaps 215.

Since the contact layers 216 are on surfaces of the plurality of source and drain layers 214, contact areas between the contact layers 216 and the plurality of source and drain layers 214 are increased, thereby reducing contact resistances on the surfaces of plurality of the source and drain layers 214, thereby improving performance of a device.

A material of the contact layers 216 includes metal silicide. The metal silicide includes tungsten silicide, cobalt silicide, titanium silicide, cobalt silicide, nickel silicide, and the like. In the embodiment, the material of metal silicide is tungsten silicide.

A process of forming the contact layers 216 includes an atomic layer deposition process. The atomic layer deposition process helps to improve filling of the contact layer material in the gaps and improve performance of the formed contact layers.

Figure 13:
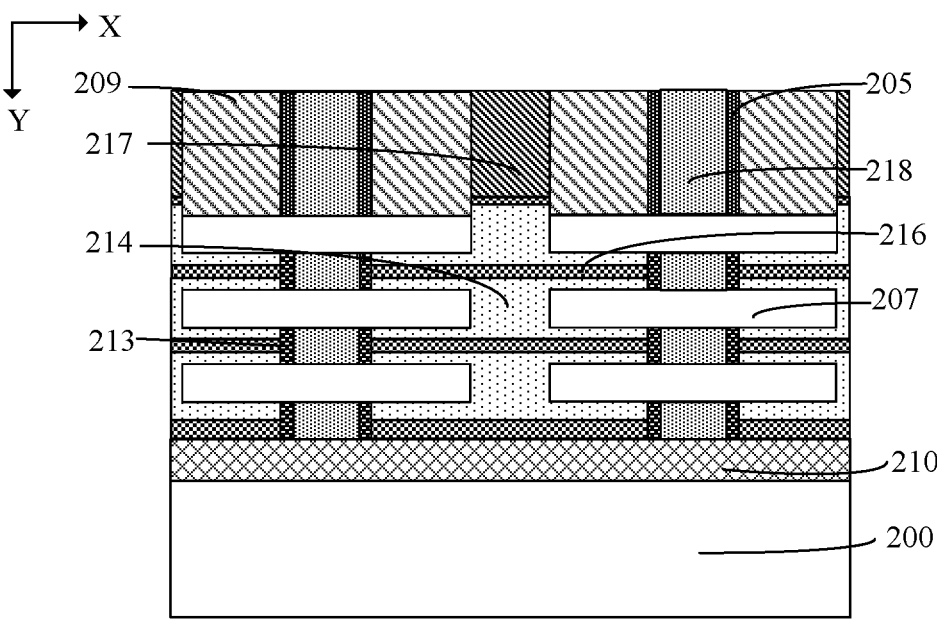

A view direction of FIG. 13 is same as a view direction of FIG. 10. The method for forming a semiconductor structure further includes forming an interlayer dielectric material layer (not shown) on the substrate 200, and the interlayer dielectric material layer being on sidewalls and top surfaces of the dummy gate structures 203; planarizing the interlayer dielectric material layer until dummy gate layers 204 are exposed; and forming an interlayer dielectric layer 217.

Subsequently, conductive structures 217 are formed on surfaces of the contact layers 216 on the plurality of source and drain layers 214.

In the embodiment, after the interlayer dielectric layer 217 is formed and before the conductive structure 220 is formed, the method for forming a semiconductor structure further includes: removing the dummy gate layers 204, and forming gate openings in the interlayer dielectric layer 217 (not shown); removing the sacrificial layers 212 exposed by the gate openings to form second openings (not shown) between adjacent channel layers 207, forming composite layers by using the initial composite layers; and forming gate structures 218 in the gate openings in the second openings.

A gate structure 218 includes a gate dielectric layer (not marked) in the gate opening and the second opening, and a metal gate (not marked) on a surface of the gate dielectric layer.

A view direction of FIG. 13 is same as a view direction of FIG. 10. A conductive structure 220 is formed on a surface of a contact layer 216 on a source and drain layer 214.

A method for forming the conductive structure 220 includes: forming a third opening (not shown) in the interlayer dielectric layer 217, the third opening exposing the contact layer 216 on a top surface of the source and drain layer 214; and forming the conductive structure 220 in the third opening.

In the embodiment, before forming the third opening, a dielectric layer 219 is also formed on surfaces of the interlayer dielectric layer 217 and the gate structure 218. The third opening is also in the dielectric layer 219.

Figure 14:
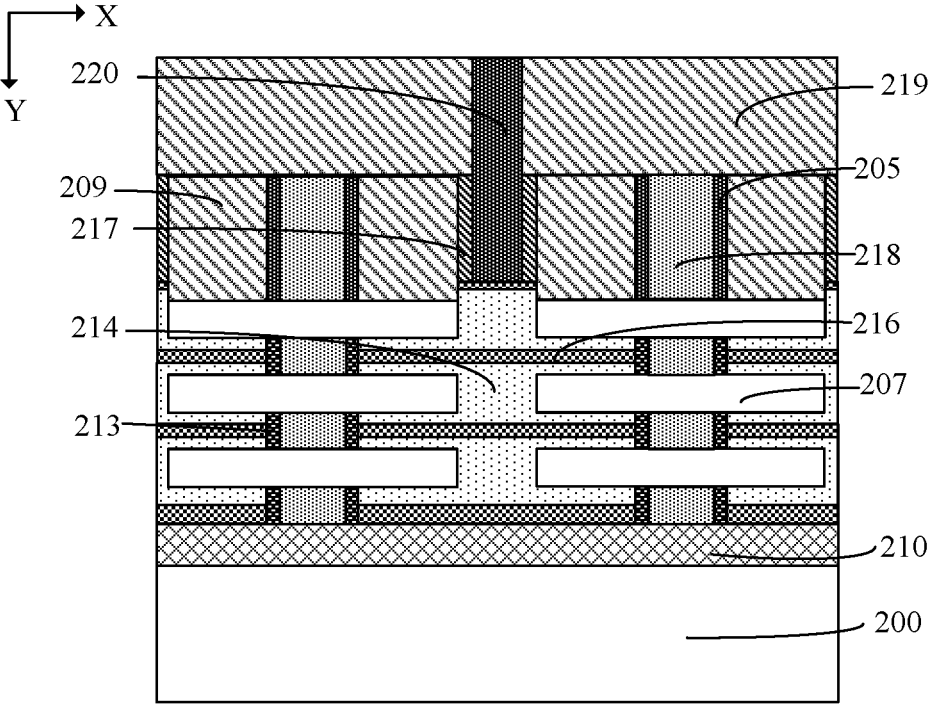

Correspondingly, another embodiment of the present disclosure further provides a semiconductor structure formed by the above method. Referring to FIG. 14, the semiconductor structure includes: a substrate 200; a plurality of composite layers on a portion of the substrate 200, the plurality of composite layers extending along a first direction, the plurality of composite layers having a first opening 206 (shown in FIG. 10), and the first opening 206 exposing a surface of the substrate 200, a composite layer of the plurality of composite layers including a plurality of channel layers 207 stacked along a normal direction of the surface of the substrate 200 and second openings (not shown) between two adjacent channel layers 207, and the second opening making space between two adjacent channel layers 207, and grooves 211 on sidewalls of the second openings being between the two adjacent channel layers 207; gate structures 218 on surfaces of the plurality of channel layers 207 and in the second openings, the gate structures 218 surrounding the plurality of channel layers 207 and extending along a second direction, the first direction and the second direction being perpendicular to each other; dielectric spacers 209 on sidewalls of the gate structures 218, top surfaces of the dielectric spacers 209 being flush with top surfaces of the gate structures 218, and outer side surfaces of the dielectric spacers 209 being flush with sidewall surfaces of the plurality of channel layers 207; a composite layer of the plurality of composite layers further including inner sidewall spacers 213 in the grooves and on sidewalls of the second openings, and sidewalls of the inner sidewall spacers being recessed relative to the sidewalls of the channel layer 207; a plurality of source and drain layers 214 on the surfaces of the plurality of channel layers 207 exposed by the first opening 206 and the grooves 211, the plurality of source and drain layers 214 being parallel to the first direction X and distributed along a second direction Y, the second direction Y being parallel to a normal direction of the substrate surface 200, and gaps 215 being between adjacent source and drain layers; contact layers 216 on surfaces of the plurality of source and drain layers 214 and in the gaps 215; and a conductive structure 220 on a source and drain layer of the plurality of source and drain layers 214.

Since the contact layers 216 are on surfaces of the source and drain layers 214, contact areas between the contact layers 216 and the source and drain layers 214 are increased, thereby reducing contact resistances on the surfaces of the source and drain layers 214, thereby improving performance of a device.

In the embodiment, an insulating dielectric layer is further provided on the substrate, the plurality of composite layers is on a portion of a surface of the insulating dielectric layer, and the insulating dielectric layer is exposed by the first opening.

A material of the contact layer 216 includes metal silicide.

Compared with the existing semiconductor structure, the technical solution of the present disclosure has the following advantages.

In the method for forming a semiconductor structure provided by the technical solution of the present disclosure, a selective epitaxial growth process is applied to form a plurality of source and drain layers on surfaces of channel layers exposed by the first opening and the grooves. The plurality of source and drain layers are parallel to the first direction and distributed along the second direction. The second direction is parallel to a normal direction of the substrate, gaps are formed between adjacent source and drain layers, and contact layers are formed on surfaces of the plurality of source and drain layers and in the gaps. Since the contact layers are on the surfaces of each source and drain layer, contact areas between the contact layers and the plurality of source and drain layers are increased, thereby reducing contact resistances on the surfaces of the plurality of source and drain layers, thereby improving performance of a device. Further, the selective epitaxial growth process includes a plurality of film forming processes, and each film forming process includes forming a material film, and an etching process after forming the material film, which reduces number of layers along the second direction and a possibility of connecting the source and drain layers, helps to optimize qualities of formed source and drain layers, and improve qualities of the formed source and drain layers. Further, a process of forming the contact layers includes an atomic layer deposition process, which helps to improve filling of a contact layer material in the gaps and improve performances of formed contact layers.

Although the present disclosure is described as above, the present disclosure is not limited thereto. A person skilled in the art can make various changes and modifications without departing from the spirit and scope of the present disclosure. The protection scope of the present disclosure should be subject to the scope defined by the claims.

What is claimed is:

1. A semiconductor structure, comprising:
   a substrate; and
   a composite layer over the substrate, the composite layer including a plurality of channel layers and at least one structure layer, and one of the at least one structure layer including:
   a first gate structure,
   inner sidewall spacers on both sides of the first gate structure, a source layer and a drain layer on each side of the inner sidewall spacer, and a contact layer contained within each of the source layer and the drain layer, wherein:

the first gate structure, the inner sidewall spacers, a first portion of each of the source layer and the drain layer, and a first portion of the contact layer together are formed between adjacent channel layers of the plurality of channel layers and together have an orthographic projection overlapping with the adjacent channel layers along a vertical direction.

2. The structure according to claim 1, further comprising an insulating dielectric layer formed between the substrate and the composite layer.

3. The structure according to claim 1, wherein the first portion of each of the source layer and the drain layer extends outside a corresponding sidewall of the channel layer.

4. The structure according to claim 1, wherein the first portion of each of the source layer and the drain layer encapsulates a corresponding sidewall and surface portions of the channel layer that are connected to the corresponding sidewall.

5. The structure according to claim 1, wherein the first portion of the contact layer extends outside a corresponding sidewall of the channel layer.

6. The structure according to claim 1, wherein the first portion of the contact layer is located in a middle section of the source layer and the drain layer along the vertical direction.

7. The structure according to claim 1, further comprising:

a second gate structure, gate sidewall spacers, and dielectric spacers, that are formed on a top channel layer of the plurality of channel layers, wherein the gate sidewall spacers are on both sides of the second gate structure, the dielectric spacers are on sidewalls of the gate sidewall spacers and on the both sides of the second gate structure.

8. The structure according to claim 7, wherein top surfaces of the dielectric spacers are coplanar with a top surface of the second gate structure, and outer side surfaces of the dielectric spacers are coplanar with sidewall surfaces of the plurality of channel layers.

9. The structure according to claim 7, wherein a second portion of each of the source layer and the drain layer is formed on a lower portion of an outer side surface of a corresponding dielectric spacer.

10. The structure according to claim 9, further comprising:

an interlayer dielectric layer formed on top of the second portion of each of the source layer and the drain layer, wherein the interlayer dielectric layer is further formed on an upper portion of the outer side surface of the corresponding dielectric spacer.

11. The structure according to claim 1, further comprising:

a shared source/drain layer and a conductive structure formed over the shared source/drain layer, wherein a second portion of the contact layer is formed between the shared source/drain layer and the conductive structure.

12. The structure according to claim 2, wherein another one of the at least one structure layer is formed between the insulating dielectric layer and a bottom channel layer of the plurality of channel layers, and the contact layer of the another one of the at least one structure layer is formed directly on surface of the insulating dielectric layer.

13. A method for forming a semiconductor structure, comprising:

providing a substrate; and forming a composite layer over the substrate, the composite layer including a plurality of channel layers and at least one structure layer, and one of the at least one structure layer including:

a first gate structure, inner sidewall spacers on both sides of the first gate structure, a source layer and a drain layer on each side of the inner sidewall spacer, and a contact layer contained within each of the source layer and the drain layer, wherein the first gate structure, the inner sidewall spacers, a first portion of each of the source layer and the drain layer, and a first portion of the contact layer together are formed between adjacent channel layers of the plurality of channel layers and together have an orthographic projection overlapping with the adjacent channel layers along a vertical direction.

* * * * *